United States Patent [19]

Nobue et al.

[11] 4,044,297

[45] Aug. 23, 1977

[54] ULTRASONIC GENERATOR WITH COMBINED OSCILLATOR AND CURRENT REGULATOR

[75] Inventors: Takaaki Nobue, Yamatokoriyama; Masao Itou, Nara; Katsuhiko Yamamoto, Nabari; Makoto Hori, Ikoma, all of Japan

[73] Assignee: Matsushita Electric Industrial Co., Ltd., Japan

[21] Appl. No.: 637,875

[22] Filed: Dec. 5, 1975

[30] Foreign Application Priority Data

May 20, 1975 Japan .................................. 50-60822
June 19, 1975 Japan .................................. 50-75133

[51] Int. Cl.[2] ............................ G05F 1/44; H03F 3/18

[52] U.S. Cl. .......................................... 323/4; 310/317; 331/108 A; 331/116 R; 239/102

[58] Field of Search ................ 323/4, 23, 25; 310/8.1; 331/116 R, 159, 108 A, 114; 330/13; 239/102, 4; 431/1; 318/116; 321/2, 18

[56] References Cited

U.S. PATENT DOCUMENTS

| | | | |
|---|---|---|---|
| 3,526,845 | 9/1970 | Sikorra | 330/13 X |
| 3,790,079 | 2/1975 | Berglund et al. | 239/102 |
| 3,851,269 | 11/1974 | Szorc | 330/13 |
| 3,885,902 | 5/1975 | Fujieda et al. | 239/102 X |
| 3,955,545 | 5/1976 | Priegel | 239/102 X |

*Primary Examiner*—Gerald Goldberg
*Attorney, Agent, or Firm*—Burgess, Ryan and Wayne

[57] ABSTRACT

An ultrasonic generator comprising an ultrasonic transducer having a natural frequency at which the dynamic admittance becomes maximum; a main circuit consisting of a switching circuit or first current regulator and a second current regulator connected in series to said switching circuit or first current regulator, the ultrasonic transducer being interconnected between an electrical source and the junction between said switching circuit or first current regulator and the second current regulator; a driving circuit for alternately driving the switching circuit or first current regulator and the second current regulator at a frequency equal to or substantially equal to the natural frequency of the ultrasonic transducer, thereby supplying the driving current thereto; and a feedback circuit for deriving an AC voltage in proportion to the magnitude of the driving current and feeding back this voltage to the driving circuit.

8 Claims, 9 Drawing Figures

ULTRASONIC GENERATOR WITH COMBINED OSCILLATOR AND CURRENT REGULATOR

BACKGROUND OF THE INVENTION

The present invention relates to generally an ultrasonic transducer in which an piezoelectric or magnetostrictive ultrasonic transducer is driven at the natural frequency thereof or at a frequency substantially equal thereto, and more particularly an ultrasonic generator including a circuit for maintaining the constant amplitude of mechanical oscillation of the ultrasonic transducer and another circuit for ensuring the stable, dependable and efficient mechanical oscillations of the ultrasonic transducer and which generator is simple in construction, compact in size, light in weight and easy to manufacture.

The piezoelectric or magnetostrictive ultrasonic transducers are widely used for converting the electrical oscillation into mechanical oscillations so that the ultrasonic waves may be used for various purposes such as cleaning, welding, atomizing of liquid and so on. In some ultrasonic generators, in order to amplify the mechanical oscillations of the ultrasonic transducer, a horn is attached thereto so that the mechanical oscillations with a higher amplitude produced at the free end of the horn may be used for atomizing liquid fuel or welding.

The prior art liquid fuel combustion devices incorporating the ultrasonic generator with a horn for atomizing the liquid fuel present the following problems: Firstly, in order to ensure the efficient operation of the ultrasonic transducer having a high quality factor Q, the transducer must be driven at the natural frequency thereof or at a frequency substantially equal thereto, but the natural frequency is dependent upon the shape and dimensions of the transducer and changes with the temperature variation. Therefore the oscillator for driving the ultrasonic transducer must oscillate at a frequency equal to the natural frequency of the transducer or at a frequency substantially equal thereto. Secondly, when the ultrasonic generator is used for atomizing the liquid, the amplitude of mechanical oscillations of the transducer must be such that the liquid may be atomized into particles having substantially the same particle size. If the amplitude is increased excessively, cavitation occurs, resulting in the larger particle sizes. On the other hand, when the amplitude is small, the atomization of the liquid cannot be satisfactorily attained. Thirdly, at the initial stage of the atomization, the driving current supplied to the transducer must be higher than in the steady state because a relatively large amount of the liquid on the atomizing surface at the start of the atomization cannot be satisfactorily atomized unless the amplitude of mechanical oscillations of the atomizing surface is considerably greater than that in the steady state. This phenomenon shall be referred to as the "hysteresis phenomenon" in this specification. This hysteresis phenomenon inevitably occurs in the liquid fuel combustion devices in which the liquid fuel is atomized into very small particle sizes in order to improve the combustion efficiency.

In order to overcome the problems described above, there has been proposed an ultrasonic generator to be described hereinafter with reference to FIG. 1, but unless the ultrasonic transducer thereof is driven at the natural frequency thereof or at a frequency very close thereto, the amplitude of mechanical oscillations sufficient for atomization of liquid cannot be obtained. Therefore, the natural frequency must be automatically detected to solve the first problem. Since the quality factor Q of the ultrasonic dynamic transducer is considerably high at its resonant frequency, the impedance is extremely small at the resonant frequency or at a frequency very close thereto so that when the voltage is applied to the transducer, the maximum current is obtained at the natural or resonant frequency. Therefore, the first problem may be overcome by the positive feedback of the voltage representative of the driving current flowing through the transducer. The second problem is to maintain constant the amplitude of mechanical oscillations of the ultrasonic transducer. To solve this problem, it is required to detect the amplitude by some suitable means in order to attain the feedback of the amplitude. In general, the amplitude of mechanical oscillation of the ultrasonic transducer is in proportion to the current flowing therethrough. Therefore, in the above prior art generator, the current flowing through the transducer is detected to change the voltage supplied from the electrical power source, thereby maintaining constant the current flowing through the transducer and consequently the amplitude of mechanical oscillations thereof. When a single-ended push-pull output-transformerless type Class B amplifier circuit is used, the current flowing therethrough is equal to that flowing through the ultrasonic transducer. Therefore, the transducer may be driven by a constant current supplied from a constant current supply circuit or current regulator without changing the voltage of the power source.

The third problem is to increase the magnitude of the driving current to be applied to the ultrasonic transducer for a predetermined time after the start of the liquid atomization. This problem may be solved in a simple manner by the combination of a delay circuit and two-level current regulators.

SUMMARY OF THE INVENTION

One of the objects of the present invention is therefore to provide an ultrasonic generator especially adapted for use in a liquid atomizing device or the like and including an oscillator of the type in which the voltage representative of the magnitude of the current flowing through an ultrasonic transducer may be positively fed back so as to drive the transducer at the natural frequency thereof or at a frequency substantially equal thereto, whereby the transducer may oscillate with the amplitude sufficient for ensuring the satisfactory atomization of the liquid.

Another object of the present invention is to provide an ultrasonic generator in which the output circuit consists of a current regulator or regulators so that the constant amplitude of mechanical oscillations of the transducer may be maintained without changing the voltage of the electrical power source.

A further object of the present invention is to provide an ultrasonic generator including a delay circuit so that the high-level driving current may be supplied to the ultrasonic transducer for a predetermined interval of time after the ultrasonic generator is started and that after a predetermined time interval, the driving current is switched to a low level for the steady-state operation of the generator.

A further object of the present invention is to provide an ultrasonic generator including a current regulator or regulators so that the positive feedback of the voltage representative of the magnitude of the current flowing through the ultrasonic transducer may be carried out so as to drive the transducer at the natural frequency thereof, the current regulator or regulators being of the type capable of producing one of the two-level outputs, when they are switched by a delay circuit or the like.

A further object of the present invention is to provide an ultrasonic generator in which an oscillator and a current regulator are combined into a very simple configuration in order to reduce the number of components, whereby the generator may be made compact in size, light in weight and simple in construction yet very reliable and dependable in operation.

A further object of the present invention is to provide an ultrasonic generator with a current regulator or regulators which are very inexpensive to manufacture, so that the mass production of the ultrasonic generator may be much facilitated.

A further object of the present invention is to provide an ultrasonic generator in which an oscillator and a current regulator or regulators are combined as a unit which is driven at a constant voltage through constant-voltage-regulating means such as a zener diode capable of handling from DC to high frequency so that even when the output of the oscillator is short-circuited, the constant current may flow therethrough and consequently the safety of the generator may be guaranteed.

A further object of the prsent invention is to provide an ultrasonic generator capable of producing the maximum output with a constant amplitude so that the generator is best adapted for use with an ultrasonic liquid atomizing device or ultrasonic liquid fuel combustion device.

A further object of the present invention is to provide an ultrasonic liquid atomizing device incorporating the ultrasonic generator of the type described above so as to atomize the liquid into substantially the same particle size.

A further object of the present invention is to provide an ultrasonic liquid fuel combustion device incorporating the ultrasonic generator of the type described.

A further object of the present invention is to provide an ultrasonic liquid fuel combustion device compact in size and light in weight and capable of attaining the very satisfactory combustion characteristics.

To the above and other ends, the present invention provides an ultrasonic generator comprising a main circuit comprising a switching circuit or first current regulator, a second current regulator connected in series to the switching or first current regulator, and an ultrasonic transducer with a natural frequency at which the dynamic admittance becomes maximum and connected between an electrical power source and the junction between the switching or first current regulator and the second current regulator; a driving circuit for alternately driving the switching or first current regulator and the second current regulator at a frequency equal to or substantially equal to the natural or resonant frequency of the transducer, thereby supplying the driving current thereto; and a feedback circuit for deriving a voltage representative of the magnitude of the driving current flowing through the transducer and making the positive feedback of this voltage to the driving circuit.

BRIEF DESCRIPTION OF THE DRAWING

Same reference numerals are used to designate similar parts throughout the figures.

DESCRIPTION OF THE PREFERRED EMBODIMENTS

Figure 1:
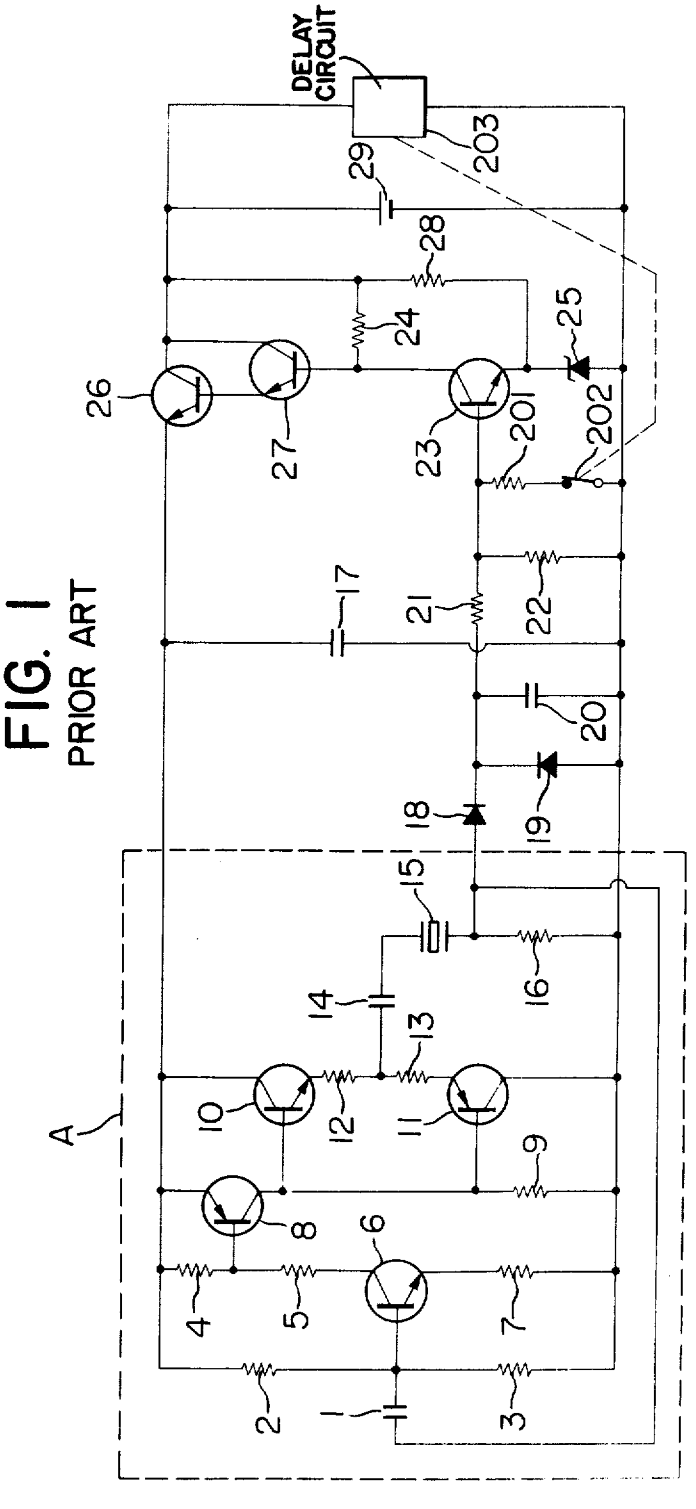
FIG. 1 PRIOR ART
FIG. 1 is a circuit diagram of an example of the prior art ultrasonic generators.

Prior Art, FIG. 1

Prior to the description of the preferred embodiments of the present invention, a prior art ultrasonic generator will be briefly described with reference to FIG. 1 in order to more distinctly and specifically point out the problems thereof. The ultrasonic generator includes an oscillator A comprising a common-emitter transistor amplifier stage consisting of a DC blocking capacitor 1, a transistor 6, bias resistors 2 and 3 thereof, a transistor 8 and bias resistors 4, 5, 7 and 9 thereof; a complementary single-ended push-pull output-transformerless amplifier stage consisting of transistors 10 and 11 and resistors 12 and 13; and a series-circuit consisting of an ultrasonic transducer 15 and a resistor 16 which circuit is connected through a DC blocking capacitor 14 to the junction between the resistors 12 and 13. Therefore the voltage across the resistor 16 is positively fed back to the base of the transistor 6 through the capacitor 1. A DC power source 29 supplies direct current to the oscillator A. Since the dynamic admittance of the transducer 15 becomes maximum at its resonance frequency *fo*, the mechanical oscillations of and the current flowing through the transducer 15 also become maximum at *fo*. As a result, the voltage across the resistor 16 also becomes maximum. Therefore, the oscillator A automatically sustains oscillations by the positive feedback of the voltage across the resistor 16 to the amplifier stage.

Next the DC (direct current) requlator for supplying the controlled current to the oscillator A will be described. The regulator comprises, in combination, the electrical power source 29, control transistors 26 and 27, bias resistors 24 and 28, a transistor 23 for detection of error and amplification, a zener diode 25 for providing reference voltage, and a capacitor 17 for preventing oscillation. The AC voltage across the resistor 16, the magnitude of which is in proportion to the magnitude of the driving current flowing through the transducer 15, is rectified and smoothed by a rectifier and smoothing circuit consisting of diodes 18 and 19 and a capacitor 20. Therefore, the DC voltage across the capacitor 20 is also in proportion to the driving current flowing through the transducer 15. Since the amplitude of mechanical oscillations of the transducer 15 is in proportion to the driving current, it may be kept constant when the output voltage from the DC supply 29 is so controlled that the DC voltage across the capacitor 20 may be maintained constant. That is, when the DC voltage across the capacitor 20 is suitably divided by resistors 21 and 22 and is applied as control input voltage to the base of the transistor 23, the output voltage from the DC regulator makes the control input voltage; that is, the DC voltage across the capacitor 20 constant, and consequently the amplitude of mechanical oscillations of the transducer 15 may be kept constant as will be described in detail hereinafter.

Because the resistor 28 and the zener diode 25 are connected to the emitter of the transistor 23, the emitter voltage thereof may be kept constant. As a result, the transistor 23 will not be turned on unless the base voltage of the transistor 23 rises in excess of the emitter voltage thereof. When the current flows into the base of the transistor 27 through the resistor 24 from the source 29, both the transistors 27 and 26 are turned on so that the current may be supplied to the oscillator A. When the voltage across the resistor 16 rises with the increase in the driving current flowing through the transducer 15, the base voltage of the transistor 23 also rises, thereby turning it on. As a result, the voltage drop across the resistor 24 increases, resulting in the increase in voltage between the collector and emitter of the transistors 26 and 27. Consequently, the output voltage from the DC regulator drops, resulting in the decrease in the amplitude of mechanical oscillations of the transducer 15. The above operation is cycled until the control input voltage to the base of the transistor 23 recovers to a predetermined level. Thus the amplitude of mechanical vibrations of the transducer 15 may be kept constant. On the other hand, when the amplitude drops below a predetermined level, the above operation is reversed so that the amplitude rises to a predetermined level.

When a series-circuit consisting of a resistor 201 and a normally closed contact 202 of a delay circuit 203 is connected in parallel with the resistor 22, the amplitude of mechanical oscillations of the transducer 15 may be made larger than that in the stationary state, but it may be lowered to a predetermined level when the normally closed contact 202 is opened after a predetermined interval of time. This feature is advantageous when the ultrasonic generator is incorporated into a liquid fuel combustion device because when the device is started, a liquid-fuel atomizing device or the like may be vibrated with a larger amplitude for atomizing liquid fuel for a predetermined time after the start.

As described above, in the prior art ultrasonic generator the driving current flowing through the transducer 15 is converted into the voltage which is fed back to the DC regulator. Therefore, a power transistor capable of handling a greater power is required, and a larger number of resistors are used. As a result, it has been difficult to design the ultrasonic generator compact in size and simple in construction. Consequently, the ultrasonic liquid atomizing devices and ultrasonic liquid fuel combustion devices incorporating of the ultrasonic generators of the type described could not be made compact in size, simple in construction and light in weight and manufactured at less cost.

THE INVENTION

Figure 2:
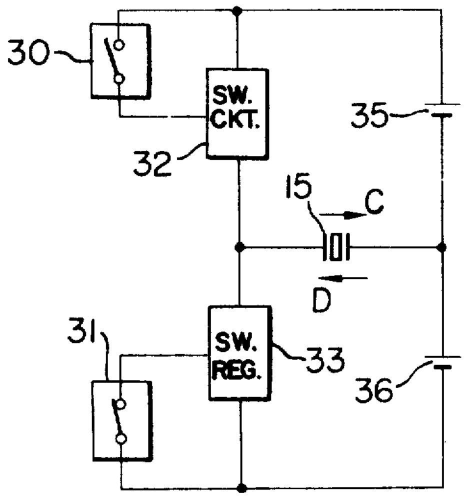
FIG. 2 is a diagram of the basic circuit of the ultrasonic generator in accordance with the present invention.

Basic Circuit, FIG. 2

Next referring to FIG. 2, the basic circuit of the ultrasonic generator in accordance with the present invention will be described. Reference numerals 35 and 36 denote DC (direct current) sources; 15, the ultrasonic transducer; 32, a current regulator or switching circuit; 33, a current regulator; and 30 and 31, switching circuits for alternately turning on and off the switching circuit 32 and the current regulator 33, respectively. That is, when the switching circuit 30 is turned on, the switching circuit 31 is turned off, and when the former is turned off, the latter is turned on. When the switching circuit 30 is turned on, the current regulator or switching circuit 32 is turned on, but when the former is turned off, the latter is also turned off. The same is true for the switching circuit 31 and the current regulator 33.

A first terminal of the switching circuit 32 is connected to the current source 35, and a second terminal, to the transducer 15 and the current regulator 33. One terminal of the current regulator 33 is connected to the negative terminal of the source 36 whose positive terminal is connected to the transducer 15 and to the negative terminal of the source 35. The switching circuits 30 and 31 are connected in such a way that the above described operation may be carried out.

Next the mode of operation of the basic circuit with the above construction will be described. When the circuit 32 is the current regulator, it is turned on when the switching circuit 30 is turned on so that the current from the current regulator 32 flows through the transducer 15 in the direction indicated by the arrow C. Since the switching circuit 31 and hence the current regulator 33 are turned off, the current with a predetermined magnitude flows only from the current regulator 32 through the transducer 15. When the switching circuit 30 is turned off while the switching circuit 31 is turned on, the current regulator 32 is turned off while the current regulator 33 is turned on so that the current from the regulator 33 flows through the transducer 15 in the direction indicated by the arrow D. The magnitude of the current is determined by the current regulator 33. Therefore, when the switching circuits 30 and 31 are turned on and off at a frequency equal to or substantially equal to the resonance frequency of the transducer 15, the latter is driven by the constant current the magnitude of which is determined by the current regulators 32 and 33.

Next when the circuit 32 is the switching circuit, the constant current flows through the transducer 15 in the direction D in the manner described above, but the magnitude of the current flowing in the direction C is dependent upon the source 35 and the impedance of the transducer 15. That is, the current flowing in the direction C is not a constant current. Therefore, as compared with the case of the circuit 32 being the current regulator, the efficiency of the transducer 15 drops, but this arrangement may be satisfactorily used in practice when the change in impedance of the transducer 15 is very small. In order to solve the problem of hysteresis, the current regulators 32 and 33 may be of two-level type.

Figure 3:
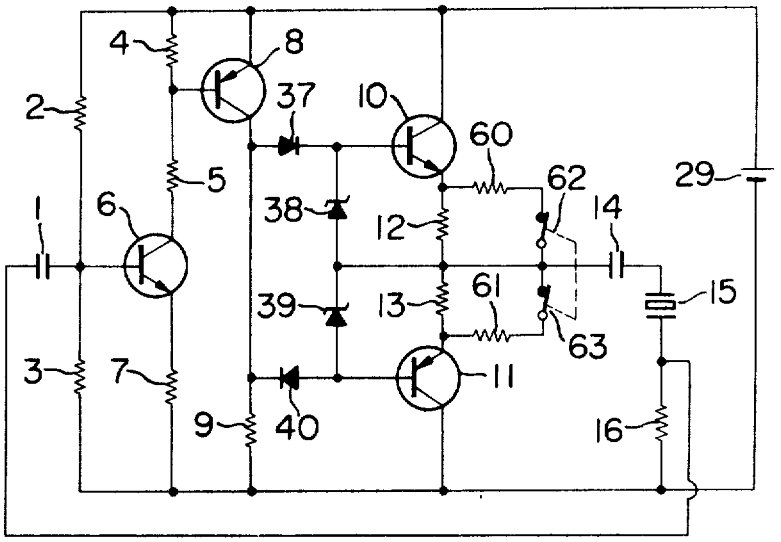
FIGS. 3, 4, 5, 6 and 7 are diagrams of some preferred practical circuits in accordance with the present invention.
Figure 4:
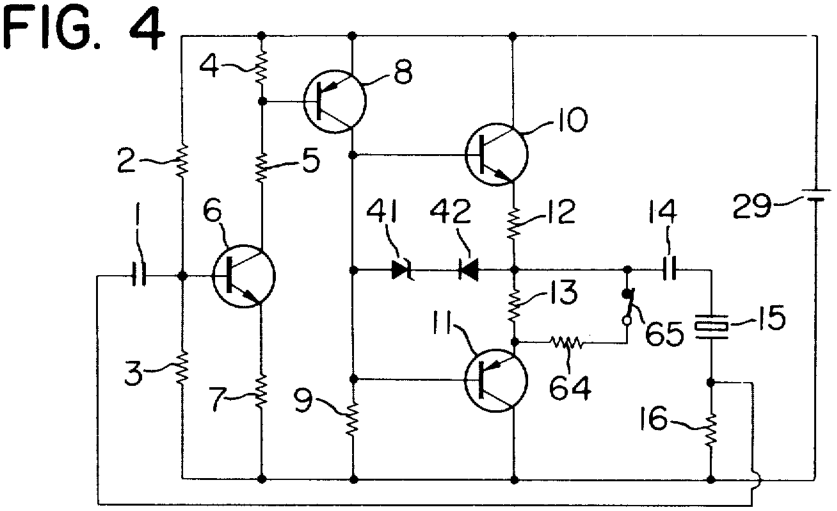

FIRST EMBODIMENT, FIGS. 3 and 4

FIG. 3 is a diagram of a circuit of the first embodiment adapted to flow the constant current both in the directions C and D. To the collector of the transistor 8 are connected the anode of a diode 37 and the cathode of a diode 40, and to the cathode of the diode 37 are connected the base of the pnp transistor 10 and the cathode of a diode 38 such as zener diode for provide a constant voltage. To the anode of the diode 40 are connected the base of the pnp transistor 11 and the anode of a zener diode 39, and the anode of the zener diode 38 and the cathode of the zener diode 39 are connected to the junction between the resistors 12 and 13.

Next the mode of operation will be described. The current $I_1$ flowing through the resistor 12 and the current $I_2$ flowing through the resistor 13 are given by $$I_1 = (V_{Z1} - V_{BE1})/R_1 \, [A] \quad (1)$$

$$I_2 = (V_{Z2} - V_{BE2})/R_2 \, [A] \quad (2)$$

where $V_{BE1}$ = base-to-emitter voltage of transistor 10;
$V_{BE2}$ = base-to-emitter voltage of transistor 11;
$V_{Z1}$ = zener voltage of diode 38, and
$V_{Z2}$ = zener voltage of diode 39.

In the circuit shown in FIG. 3, the change in zener voltage and the change in base-to-emitter voltage of the transistor due to the temperature variation are cancelled by each other so that $(V_{Z1} - V_{BE1})$ and $(V_{Z2} - V_{BE2})$ in Eqs. (1) and (2) are always constant. Therefore, the currents $I_1$ and $I_2$ given by Eqs. (1) and (2) are also constant.

The current regulator consisting of the transistor 10, the resistor 12 and the zener diode 38 corresponds to the regulator 32 shown in FIG. 2 while another current regulator consisting of the transistor 11, the resistor 13 and the zener diode 39 corresponds to the current regulator 33 of the basic circuit shown in FIG. 2.

The npn transistor 10 and the pnp transistor 11 constitute a complementary, Class B amplifier circuit in which the transistors 10 and 11 are alternately turned on and off for not only accomplishing the power amplification but also the phase reversal. That is, in response to the turn-on and turn-off operation of the transistor 8, the transistors 10 and 11 are alternately turned on and off, whereby the operations of the switching circuits 30 and 31 and the current regulators 32 and 33 are simultaneously accomplished. Thus, the transducer 15 may be driven by the constant current. The diodes 37 and 40 are connected to ensure the correct operation of the zener diodes 38 and 39 as the transistor 8 is turned on and off. If the diodes 37 and 40 are not connected and when the transistor 8 is turned on, the voltage across the base of the transistor 10 and the junction between the resistors 12 and 13 will not equal the zener voltage of the zener diode 38 and will be a forward voltage to the zener diode 39.

It is seen from the above description that when two diodes and two zener diodes are connected to the oscillator circuit A shown in FIG. 1, the ultrasonic generator is provided which is driven by the constant current.

A two-level current regulator may be provided when a series circuit consisting of a resistor 60, normally closed contacts 62 and 63 and a resistor 61 is connected in parallel with the resistors 12 and 13. Therefore, when the two-level current regulator is combined with a suitable timer or delay circuit as with the case of the prior art ultrasonic generator shown in FIG. 1, the transducer 15 may be driven by a high current only for a predetermined time after the ultrasonic liquid atomizing device or the like is started.

The voltage across the resistor 16, which is in proportion to the current flowing through the transducer 15, may be fed back to the base of the transistor 6 so that the transducer 15 may be oscillated at its resonant frequency.

FIG. 4 is a diagram of a circuit of the first embodiment of the present invention adapted to flow the constant current through the transducer 15 only in the direction D shown in the basic circuit in FIG. 2. The anode of a zener diode 41 is connected to the junction between the collector of the transistor 8 and the resistor 9 while the cathode is connected to the cathode of a diode 42 whose anode is connected to the junction between the resistors 12 and 13. The current flowing through the resistor 13 is given by $$I = (V_Z + V_D - V_{BE})/R \, [A] \quad (3)$$

where $V_Z$ = zener voltage of zener diode 41,
$V_D$ = forward voltage of diode 42,
$V_{BE}$ = base to emitter voltage of transistor 11, and
$R$ = resistance of resistor 13.

Since $V_D$ of the diode 42 and $V_{BE}$ of the transistor 11 exhibit substantially similar characteristics at the same values so that they are cancelled by each other. Therefore, Eq. (3) may be reduced into $$I \approx V_Z / R \, [A] \quad (4)$$

Therefore the zener voltage of the diode 41 is constant so that the current flowing through the resistor 13 is also constant. Thus the transistor 11, the resistor 13 and the diodes 41 and 42 function as the current regulator 33 of the basic circuit shown in FIG. 2, and the transistor 10 and the resistor 12 function as the switching circuit 32 of the basic circuit shown in FIG. 2 so that the current flowing through the resistor 12 changes. As a result, the oscillator shown in FIG. 4 has the efficiency slightly lower than that of the oscillator shown in FIG. 3, but the oscillator shown in FIG. 4 may be satisfactorily used in practice. It is seen that the number of components of the oscillator shown in FIG. 4 is increased only by two as compared with the oscillator A shown in FIG. 1.

As with the case of the oscillator shown in FIG. 3, a series circuit consisting of a normally closed contact 65 and a resistor 64 may be connected in parallel with the resistor 13 so that the amplitude of mechanical oscillation of the transducer 15 may be increased for a predetermined time after the ultrasonic liquid atomizing is started.

In the embodiment of this invention indicated in FIG. 3, a transistor 8 drives transistors 10 and 11 in the constant-current circuit alternatively; if the driving transistor 8 does not perform its "on" and "off" function properly, the voltage drop across the collector and emitter of the transistors 10 and 11 becomes larger and the base and collector currents will decrease; as the result of the decrease of current the voltage drops across resistors 12 and 13 decrease; thus the current becomes uncontrolled. The circuit of FIG. 3 inherently oscillates in such a manner that a square wave shape input is applied to the base of the transistor 8, to provide perfect switching operation, thus alleviating the aforementioned potential problems.

Similarly, in FIG. 4, a square wave shape input is also inherently applied to the transistor 8 to provide proper functioning in the circuit.

In the circuits depicted in FIGS. 3 and 4, it is quite common to improve the output wave shape by applying a little bias current to the transistors 10 and 11 from the junction of the collector of the transistor 8 and resistor 9; but it is only for the case in which the wave form distortion during the transition of conduction from the transistor 10 to transistor 11 or vice versa, of an audio amplifier where the distortion is at issue. In our invention where an ultrasonic transducer is connected at the output side, the wave form distortion is not a serious problem; no bias current is, therefore, required for the transistors 10 and 11. Therefore, the bias circuit can be eliminated, resulting in a simple circuit configuration, lower cost, and higher efficiency.

Figure 5:
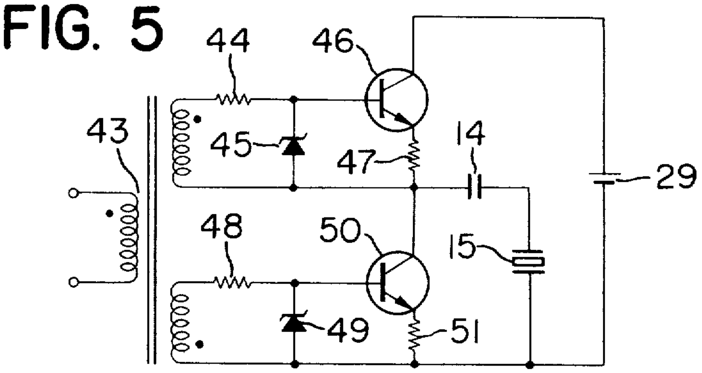
Figure 6:
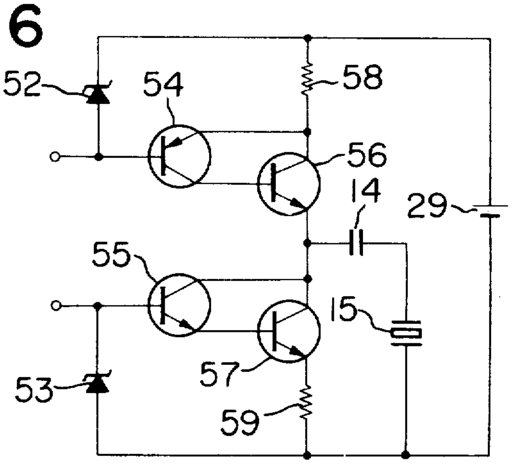

Second Embodiment. FIGS. 5 and 6

FIG. 5 is a circuit diagram of an oscillator of the second embodiment of the present invention in which two npn transistors 46 and 50 are connected into the single-ended push-pull output-transformerless configuration and are alternately turned on and off through a transformer 43. Therefore, the transistor 46, a resistor 47 and a zener diode 45 function as the current regulator 32 of the basic circuit shown in FIG. 2 while the transistor 50, a resistor 51 and a zener diode 49 function as the current regulator 33 of the basic circuit. The transformer 43 with the resistors 44 and 48 function as the switching circuits 30 and 31 of the basic circuit.

FIG. 6 is a diagram of an oscillator in which two Darlington circuits, one consisting of transistors 54 and 56 and the other, transistors 55 and 57, are connected into a configuration similar to the complementary signal-ended push-pull output-transformerless circuit. The transistors 54 and 56, a zener diode 52 and a resistor 58 function as the current regulator 32 of the basic circuit shown in FIG. 2, and the transistors 55 and 57, a zener diode 53 and a resistor 59, as the current regulator 33 of the basic circuit.

The transducer 15 may be of piezoelectric or magnetostrictive type, and any suitable elements capable of the functions of the diodes and zener diodes may be employed. Any suitable current regulators and switching circuits of even a mechanical type may be used. The two current sources shown in FIG. 2 are electrically equivalent to one electrical source with an output capacitor as in the embodiments described above.

Figure 7:
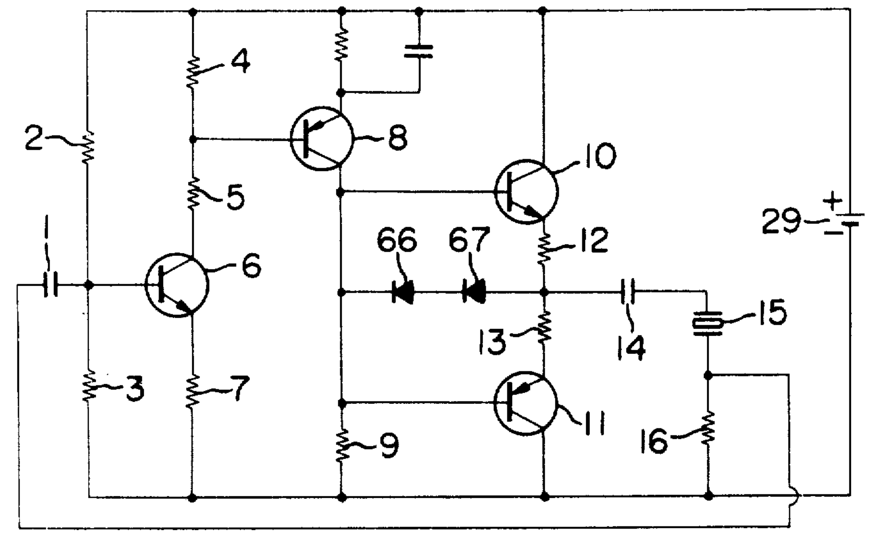

Third Embodiment, FIG. 7

In the third embodiment shown in FIG. 7, two diodes 66 and 67 are connected in series to utilize the forward voltages thereacross. When the transistor 8 is turned on, the transistor 10 is also turned on while the transistor 11 is turned off. As a result, the diodes 66 and 67 are reverse biased so that no current flows therethrough, and the emitter current from the transistor 10 flows through the transducer 15. When the transistor 8 is turned off, the transistor 10 is also turned off while the transistor 11 is turned on. As a result, the diodes 66 and 67 are forward biased so that the current flows therethrough. The forward voltages of the diodes 66 and 67 are substantially constant. Therefore, the transistor 11, the resistor 13 and the diodes 66 and 67 constitute a current regulator.

Figure 8:
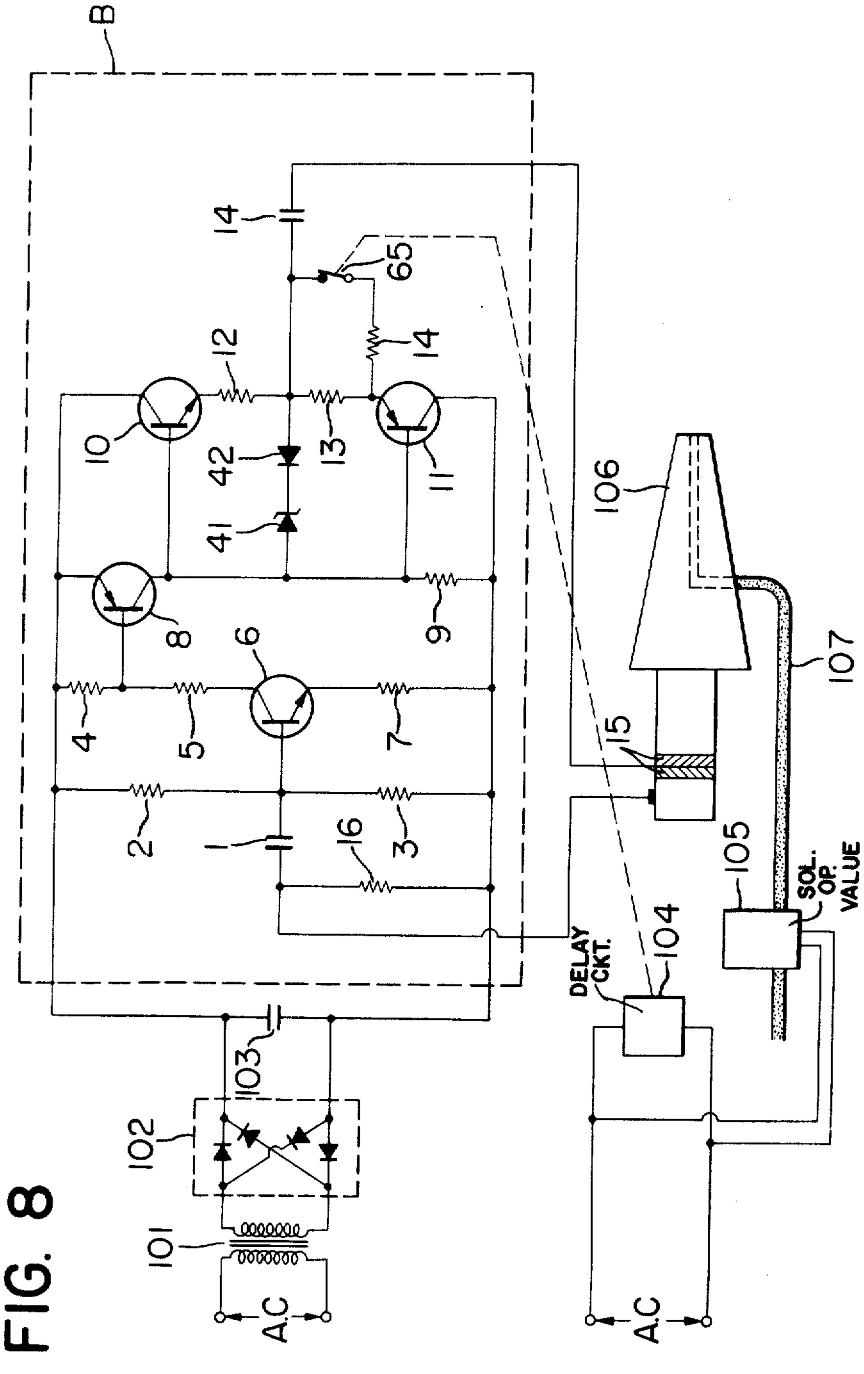
FIG. 8 is a schematic view of a liquid atomizing device incorporating the ultrasonic generator of the type shown in FIG. 4.

Liquid Atomizing Device, FIG. 8

FIG. 8 shows a liquid atomizing device incorporating the ultrasonic generator in accordance with the present invention including the oscillator of the type shown in FIG. 4. Reference numeral 101 denotes a power transformer for supplying a suitable voltage to the ultrasonic generator generally indicated by B; 102, a full-wave rectifier; 103, a smoothing capacitor; 105, a solenoid-operated valve electrically connected to an alternating current (AC) source and adapted to control the fuel to be supplied to the atomizing device; 104, a delay circuit connected in parallel with the solenoid-operated valve 105 and having a normally closed contact 65 which is opened a predetermined time after the atomizing device is started; 106, an electrorestrictive transducer; and 107, a tube for supplying the liquid. The ultrasonic generator B is substantially similar to that shown in FIG. 4 except that an AC-DC rectifier is used instead of the electric source 29.

Next the mode of operation will be described. The AC voltage in proportion to the AC voltage applied across the primary of the transformer 101 is induced in the primary thereof, and the induced voltage is rectified by the full-wave rectifier 102 and smoothed by the smoothing capacitor 103, whereby the DC current is supplied to the ultrasonic generator B. The transducer 15 is driven so that the electrorestrictive transducer 106 is driven. Since the delay circuit is not energized, the normally closed contact 65 is kept closed so that the high driving current is supplied to the transducer 15.

When the valve 105 is energized to be opened, the liquid is supplied to the transducer 106, which atomizes the liquid. When the delay circuit 104 is actuated, the normally closed contact 65 is opened so that the normal driving current is supplied to the transducer 15 for accomplishing the optimum atomization of the liquid.

The control circuit consisting of the delay circuit 104 and the normally closed contact 65 is connected in order to control the two-level current regulator 33 of the basic circuit shown in FIG. 2. For a predetermined time after the atomizing device is started, the high driving current flows through the transducer, causing the high amplitude mechanical oscillations thereof so that the problem of hysteresis which occurs at the initial stage of atomization may be overcome. After a predetermined time, the normal low driving current is supplied so that the atomization may be continued in a stabilized and efficient manner.

Figure 9:
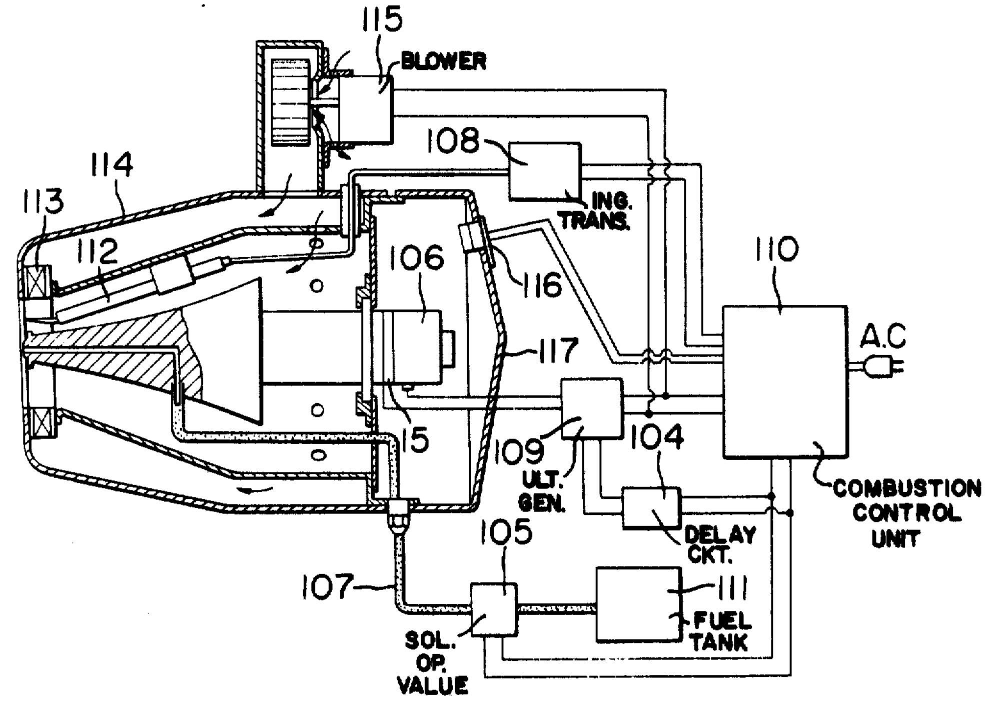
FIG. 9 is a schematic view of a liquid fuel combustion device incorporating therein the liquid atomizing device shown in FIG. 8.

Ultrasonic Liquid Fuel Combustion Device, FIG. 9

FIG. 9 shows the ultrasonic liquid fuel combustion device incorporating the liquid atomizing device of the type shown in FIG. 8. Reference numeral 108 denotes an ignition transformer; 109, the ultrasonic generator; 110, a combustion control unit; 111, a fuel tank; 112, an ignition plug; 113, swirling means adapted to swirl the combustion air; 114, a combustion tube; 115, a blower; 116, a flame detector such as CdS for detecting the combustion condition; and 117, a back cover. The delay circuit 104, the solenoid-operated valve 105, the ignition transformer 108, the ultrasonic generator 109 and the blower 115 are all controlled in response to the signals from the control unit 110.

Next the mode of operation will be described. When the power is supplied to the combustion control unit 110, the latter is actuated so that the ultrasonic generator 109 is energized. As a result, the transducer 106 is driven. Since the delay circuit 104 is not actuated, the high driving current flows into the transducer 15 so that the amplitude of mechanical oscillation of the transducer 106 is greater.

The ultrasonic generator 109 and the blower 115 are connected in parallel so that the blower 115 is also driven. After a pre-purge time, the ignition transformer 108 is energized so as to prepare for the energization of the ignition plug 112, thereby igniting the liquid fuel. Concurrently the solenoid-operated valve 105 is energized so as to flow the liquid fuel to the transducer 106, and the transducer 106 atomizes the liquid fuel. Then, the atomized fuel is ignited by the spark produced by the ignition plug 112, whereby the combustion is started. The delay circuit 104 is actuated concurrently with the solenoid-operated valve 105 so that after a predetermined time, the normal low driving current is supplied to the transducer in the ultrasonic generator. As a result, the transducer 106 sustains the optimum mechanical oscillations. When the combustion is started, the detector 116 senses the combustion and gives the signal to the control unit 110 which in turn de-energize the ignition transformer 108 after a predetermined time.

When the combustion is not carried out even when the liquid fuel is being atomized, the detector 116 does not detect the combustion light so that the control unit 110 deenergizes all the devices. Thus the safety may be guaranteed. To stop the combustion, the power supply to the control unit is interrupted.

At the atomizing surface, the hysteresis phenomenon occurs due to the atomization of liquid fuel at the initial stage of the combustion. However, by means of the delay circuit 104 and the normally closed contact 65 shown in FIG. 8, the atomizing surface is caused to vibrate more strongly for a predetermined time after the combustion device is started than in the steady state. Therefore, the problem of hysteresis may be overcomed. The atomized liquid fuel particles are mixed with the combustion air forced to flow by the blower toward the atomizing surface, and the combustion mixture is ignited by the ignition means. Thus, the combustion may be started in a very stable manner, and thereafter the desired atomization is continued by the above control means whereby the stabilized combustion may be sustained.

Instead of the electrostrictive transducer, any suitable ultrasonic transducer such as magnetostrictive type may be used.

What is claimed is:

1. An ultrasonic generator comprising:

a constant current circuit including a first bipolar transistor whose emitter is connected to one end of a resistor and base is connected to one end of a constant-voltage regulating element, the other ends of said resistor and said constant-voltage regulating element being connected together;

a first switching circuit including a second bipolar transistor whose base is connected to the base of said first transistor to form a complementary symmetry circuit with said first transistor;

an ultrasonic transducer having a natural frequency at which the dynamic admittance thereof becomes maximum, said transducer being connected between one terminal of an electric power source and the junction of an output terminal of said switching circuit and an output terminal of said constant-current circuit; said output terminal being coupled to the emitters of said transistors;

a second switching circuit whose output terminal is connected to the bases of said first and second transistors and adapted to drive the others of said circuits with a square wave having a frequency substantially equal to the natural frequency of said ultrasonic transducer; and a feedback circuit coupled between said transducer and said second switching circuit and adapted to provide an AC feedback voltage in proportion to the current flowing through said ultrasonic transducer to cause said generator to oscillate at said natural frequency.

2. An ultrasonic generator as set forth in claim 1 wherein said constant-current circuit is capable of producing two predetermined signal amplitude levels.

3. An ultrasonic atomizer including an ultrasonic generator as defined in claim 1.

4. An ultrasonic liquid fuel burner including an ultrasonic generator as defined in claim 1.

5. An ultrasonic generator characterised by the provision of (A) a main circuit comprising a. a first constant-current circuit with a first closed loop in it comprising a first transistor whose emitter is connected to one end of a first resistor and base is connected to one end of a first constant-voltage regulating element, the other ends of said first resistor and said first constant-voltage regulating element being connected together to complete a closed circuit with the base-emitter path of said first transistor;

b. a second constant-current circuit comprising a second transistor whose emitter is connected to one end of a second resistor and base is connected to one end of a second constant-voltage regulating element, the other ends of said second resistor and said second constant-voltage regulating element being connected together to complete a second closed loop with the base-emitter circuit of said second transistor, an input terminal of said second constant-current circuit, and said first transistor and said second transistor being interconnected to form a complementary symmetry circuit;

c. an ultrasonic transducer having a natural frequency at which the dynamic admittance becomes maximum and connected between an electric power source and the junction of an output terminal of said first constant-current circuit and an output terminal of said second constant-current circuit;

B. a switching circuit having an output terminal connected to the input terminal of said first constant-current circuit and the input terminal of said second constant-current circuit and adapted to drive said main circuit with a square wave having a frequency substantially equal to said natural frequency of said ultrasonic transducer;

C. a feedback circuit adapted to derive an AC voltage in proportion to the current flowing through said ultrasonic transducer and to feedback said AC voltage to said switching circuit to cause said generator to oscillate at said natural frequency.

6. An ultrasonic generator as set forth in claim 5 wherein said first and second constant-current circuits are adapted to produce the two predetermined signal amplitude levels.

7. An ultrasonic atomizer including an ultrasonic generator as defined in claim 5.

8. An ultrasonic liquid fuel burner including an ultrasonic generator as defined in claim 5.

* * * * *